United States Patent
Bishop et al.

(10) Patent No.: US 6,284,309 B1
(45) Date of Patent: Sep. 4, 2001

(54) METHOD OF PRODUCING COPPER SURFACES FOR IMPROVED BONDING, COMPOSITIONS USED THEREIN AND ARTICLES MADE THEREFROM

(75) Inventors: Craig V. Bishop, Lakewood; George S. Bokisa, North Olmsted; Robert J. Durante, Parma Hts.; John R. Kochilla, Cleveland, all of OH (US)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 08/994,184

(22) Filed: Dec. 19, 1997

(51) Int. Cl.$^7$ ................................. B05D 5/12; B44C 1/22
(52) U.S. Cl. ............................ 427/98; 427/309; 216/105; 216/106
(58) Field of Search .............................. 427/98, 123, 125, 427/309, 437; 216/87, 90, 92, 95, 105, 106, 107, 13, 20, 37, 7

(56) References Cited

U.S. PATENT DOCUMENTS

| | | | |
|---|---|---|---|
| 2,649,361 | 8/1953 | Springer et al. | 41/42 |
| 2,698,781 | 1/1955 | Meyer | 41/42 |
| 2,937,940 | 5/1960 | Weisberg et al. | 75/97 |
| 3,136,670 | 6/1964 | Rogers et al. | 156/13 |
| 3,668,131 | 6/1972 | Banush et al. | 252/79.4 |
| 3,930,965 | 1/1976 | Abbott | 204/44 |
| 4,182,784 | 1/1980 | Krulik | 427/304 |
| 4,334,966 | 6/1982 | Beach et al. | 204/25 |
| 4,582,576 | 4/1986 | Opaskar et al. | 204/44.4 |

(List continued on next page.)

FOREIGN PATENT DOCUMENTS

| | | |
|---|---|---|
| 342669 | 5/1989 | (EP) . |
| 364132 | 9/1989 | (EP) . |
| 620293 | 3/1994 | (EP) . |
| 627499 | 5/1994 | (EP) . |
| 670379 | 2/1995 | (EP) . |
| 696651 | 8/1995 | (EP) . |
| 757118 | 7/1996 | (EP) . |
| 887439 | 6/1998 | (EP) . |
| 8809829 | 12/1988 | (WO) . |
| 9619097 | 6/1996 | (WO) . |
| 96/41040 | * 12/1996 | (WO) . |

OTHER PUBLICATIONS

06116756; Apr. 26, 1994; Patent Abstract of Japan.
EP 98 31 0366; European Search Report mailed Apr. 14, 1999.
Derwent Abstract WPI Acc No. 77–47155Y/197727 for DE 25 57 269.

* cited by examiner

Primary Examiner—Gregory Mills
Assistant Examiner—George Goudreau
(74) Attorney, Agent, or Firm—Renner, Otto, Boisselle & Sklar, LLP

(57) ABSTRACT

This invention relates to a method of forming a substrate with preparing a surface capable of making a cocontinuous bond comprising the steps of 1) obtaining a copper or copper alloy substrate and 2) applying an etching composition which comprises (a) an acid, (b) an oxidizing agent, (c) a copper complexing agent, and (d) a copper complex, wherein the copper complex is present in an amount which precipitates when applied to the copper or copper alloy substrate. The method also includes the step of 3) treating the substrate with a coating composition and/or 4) applying a stripping composition to the substrate. The invention also relates to copper articles, having surface porosity, including multilayer articles such as printed circuit boards and compositions used in the method. The present invention provides microporous copper or copper alloy substrates which have improved adhesion properties to organic material.

16 Claims, 7 Drawing Sheets

U.S. PATENT DOCUMENTS

| | | | |
|---|---|---|---|
| 4,657,632 | 4/1987 | Holtzman et al. | 156/659.1 |
| 4,689,085 | 8/1987 | Plueddemann | 106/287.14 |
| 4,715,894 | 12/1987 | Holtzman et al. | 106/1.22 |
| 4,871,429 | 10/1989 | Nobel et al. | 204/44.4 |
| 4,882,202 | 11/1989 | Holtzman et al. | 427/98 |
| 4,902,551 | 2/1990 | Nakaso et al. | 428/137 |
| 5,039,576 | 8/1991 | Wilson | 428/626 |
| 5,073,456 | 12/1991 | Palladino | 428/446 |
| 5,160,422 | 11/1992 | Nishimura et al. | 205/254 |
| 5,196,053 | 3/1993 | Dodd et al. | 106/1.22 |
| 5,217,751 | 6/1993 | King et al. | 427/98 |
| 5,326,454 * | 7/1994 | Engelhaupt | 205/67 |
| 5,435,838 | 7/1995 | Melton et al. | 106/1.22 |
| 5,554,211 | 9/1996 | Bokisa et al. | 106/1.22 |
| 5,569,545 | 10/1996 | Yokono et al. | 428/626 |
| 5,614,324 | 3/1997 | Poutasse et al. | 428/447 |
| 5,643,657 | 7/1997 | Dueber et al. | 428/209 |
| 5,679,444 | 10/1997 | Davis et al. | 428/209 |
| 6,063,172 * | 5/2000 | Bokisa et al. | 427/437 |

METHOD OF PRODUCING COPPER SURFACES FOR IMPROVED BONDING, COMPOSITIONS USED THEREIN AND ARTICLES MADE THEREFROM

FIELD OF THE INVENTION

This invention relates to copper articles with a surface capable of forming a cocontinuous bond, and methods and compositions of making the same.

BACKGROUND OF THE INVENTION

It is an ongoing problem to bond organic materials to metal surfaces. When the bond between the metal surface and the organic material is exposed to heat delamination may occur. Delamination is the separation of the organic material which was bonded to the metal surface. Multilayer printed circuit boards (PCB's) are typically constructed by interleaving imaged conductive layers, such as one containing copper with non-conductive layers such as a partially cured B-stage resin, i.e., a prepreg, into a multilayer sandwich which is then bonded together by applying heat and pressure. The conductive layer, e.g., copper circuitry, does not bond well to the non-conductive B-stage resin prepreg. Often intermediate layers are used to bond the B-stage prepreg to the copper circuitry.

To improve bonding, metal surfaces have been physically roughened to provide increased surface area for bonding. Also, the metal surfaces have been treated with chemicals to roughen the metal surface and improve adhesion. Metal oxide layers, such as immersion coatings of tin, have been placed on the surface of the metal to improve adhesion.

WO 9619097 relates to metal surfaces, usually copper, which are micro- roughened to improve adhesion of polymeric materials. The metal surfaces, usually copper, which are micro-roughened by use of an adhesion promoting composition comprising hydrogen peroxide, an inorganic acid, a corrosion inhibitor, such as a triazole, tettrazole, or imidazole.

SUMMARY OF THE INVENTION

This invention relates to a method of preparing a surface capable of making a cocontinuous bond comprising the steps of 1) obtaining a copper or copper alloy substrate and 2) applying an etching composition which comprises (a) an acid, (b) an oxidizing agent, (c) a copper complexing agent, and (d) a copper complex, wherein the copper complex is present in an amount which precipitates when applied to the copper or copper alloy substrate. The method also includes the step of 3) treating the substrate with a coating composition and/or 4) applying a stripping composition to the substrate. The invention also relates to copper articles, having surface with interconnected channels capable of forming a cocontinuous bond including multilayer articles such as printed circuit boards and compositions used in the method. The present invention provides a copper or copper alloy substrates which have improved adhesion properties to organic material.

DESCRIPTION OF THE PREFERRED EMBODIMENTS

Figure 1:
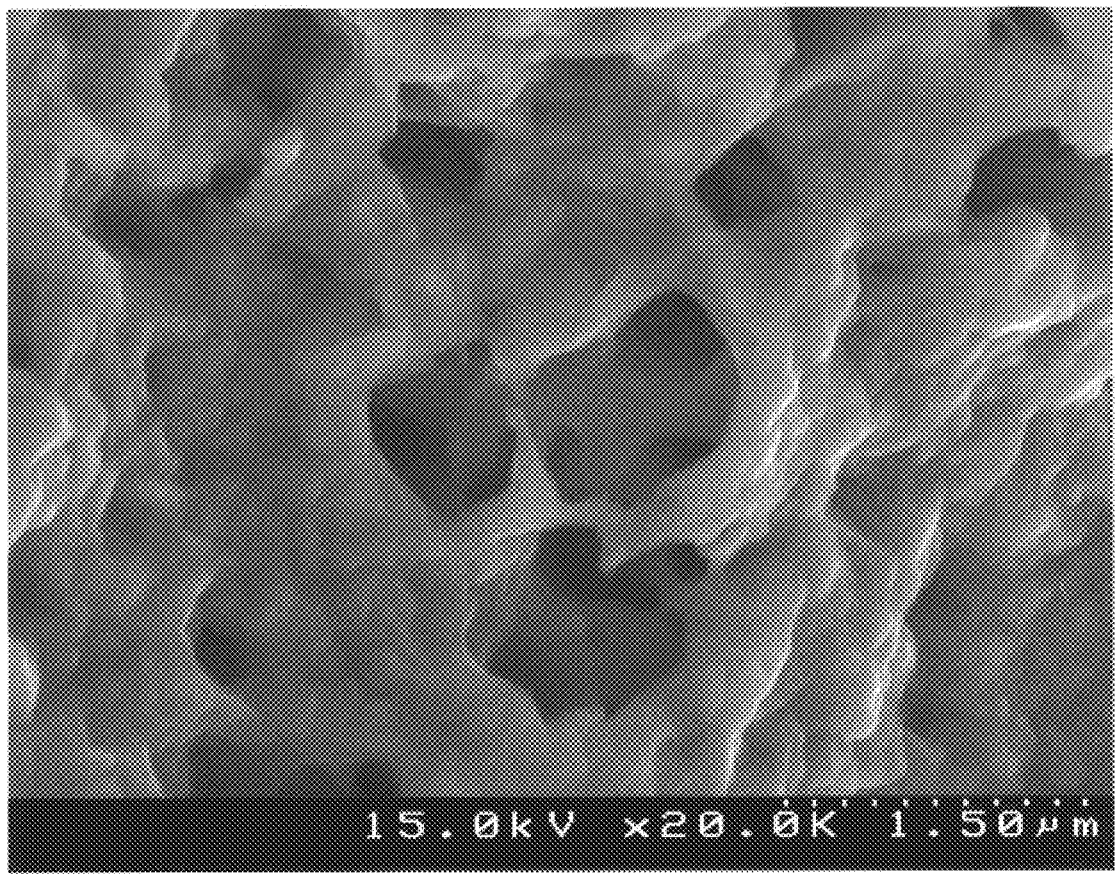
FIG. 1 is a scanning electron photomicrograph of a microporous surface (magnification factor of 20,000×) prepared by the method of the current invention.
Figure 2:
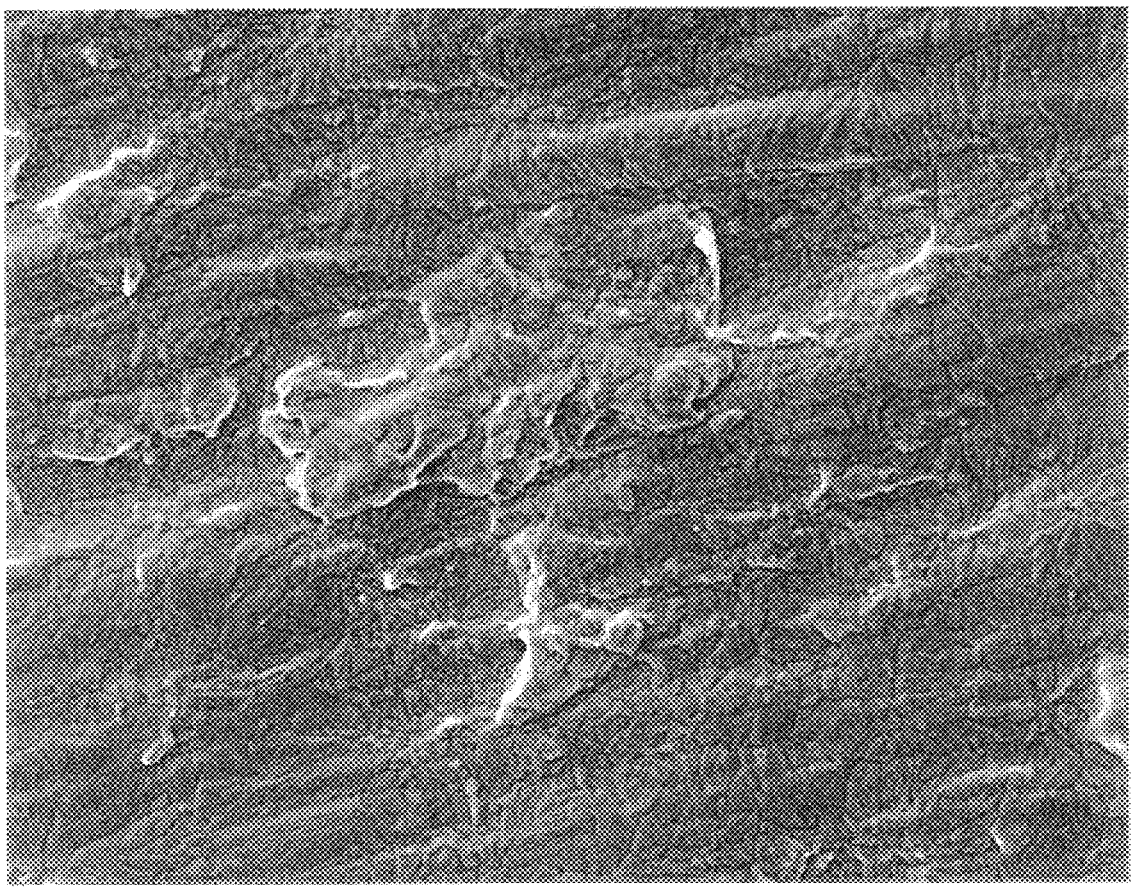
FIG. 2 is a scanning electron photomicrograph of an untreated conventional copper surface (surface magnification factor of 5,000×).
Figure 3:
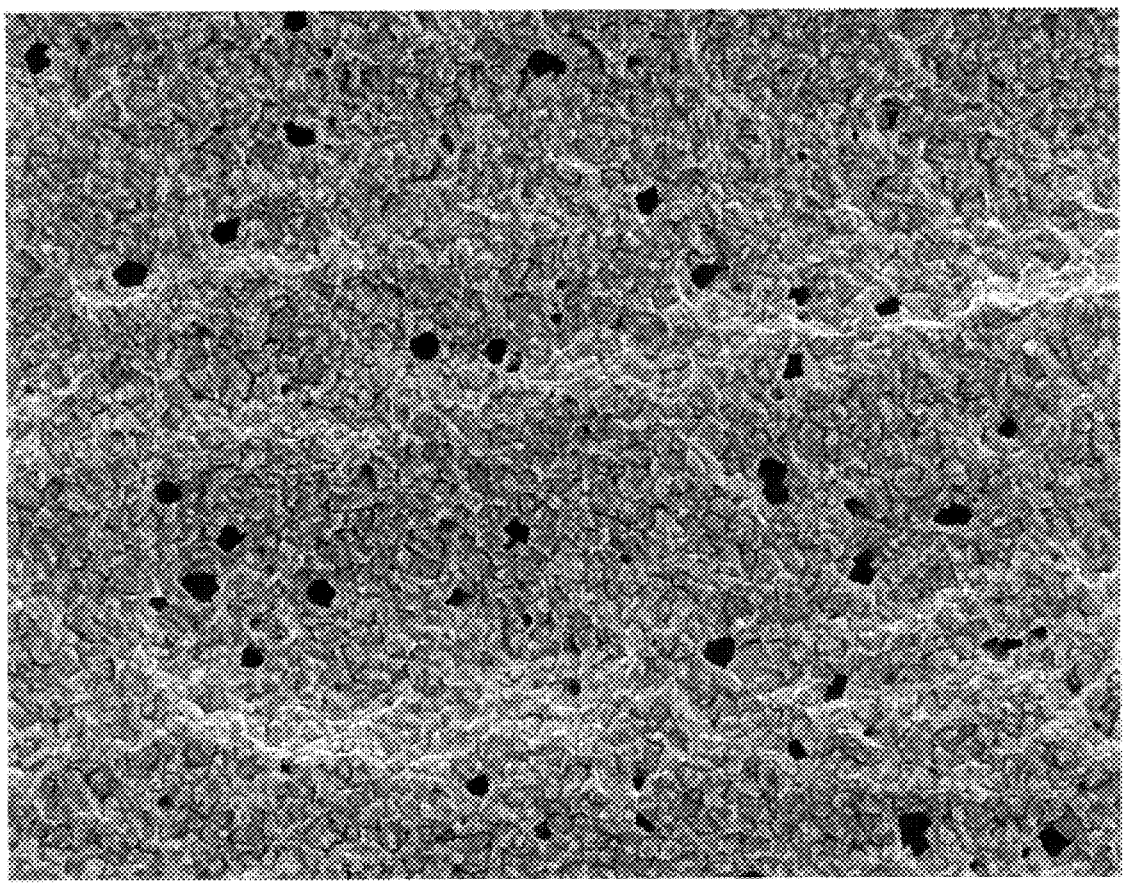
FIGS. 3 and 4 are scanning electron photomicrographs (surface magnification factor of 5,000×) which illustrate the surface structures achieved by the methods of the invention.
Figure 4:
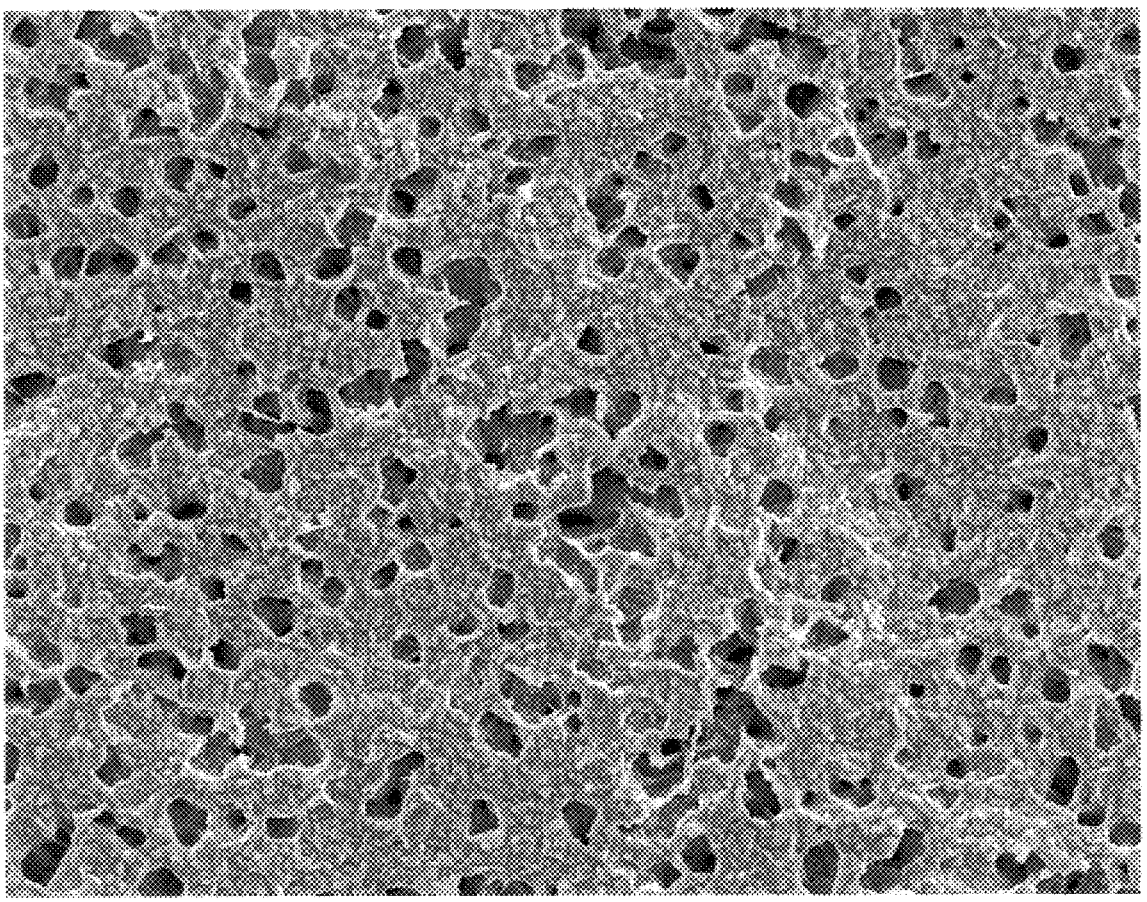
Figure 5:
FIG. 5 is a scanning electron photomicrograph of an untreated vendor modified drum side treated copper surface, also called reverse treat (surface magnification factor of 5,000×).
Figure 6:
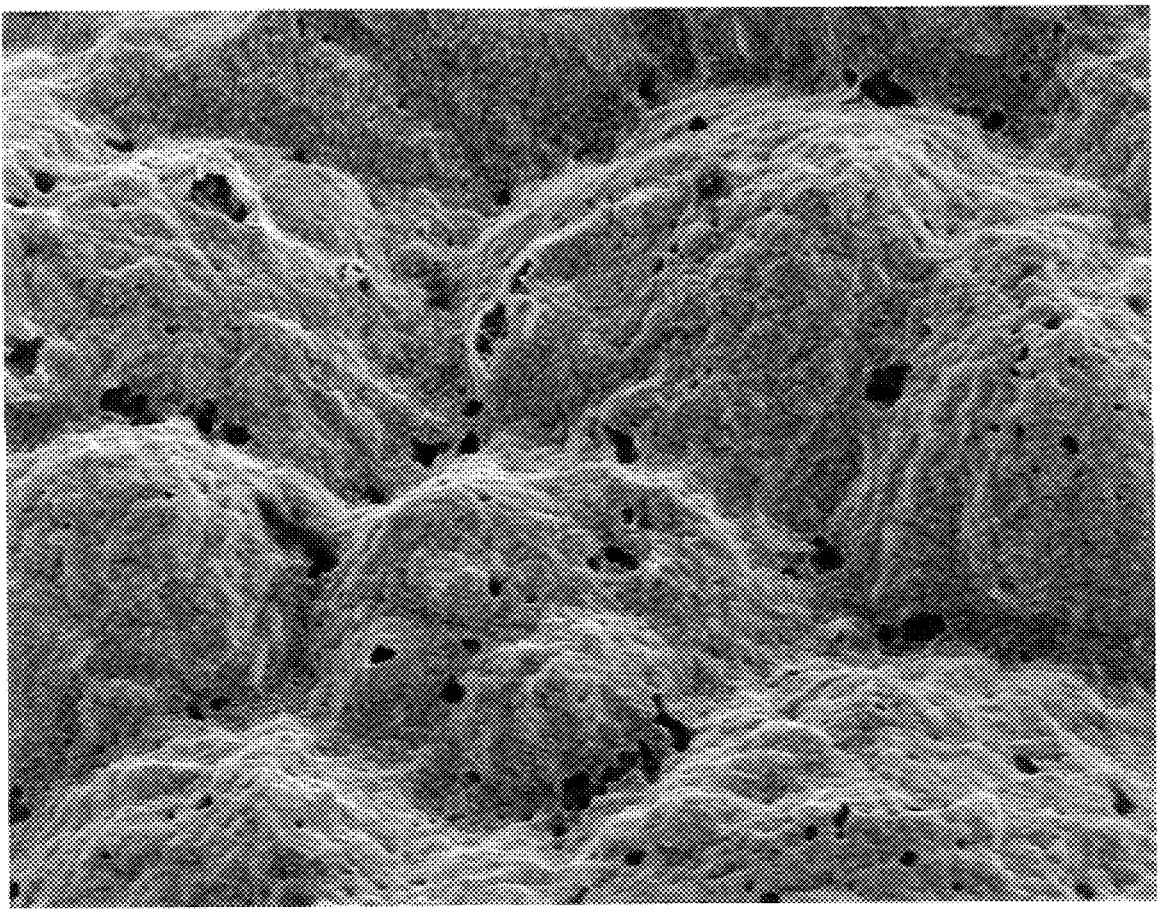
FIGS. 6–7 are scanning electron photomicrograph of a drum side treated copper surface which has been prepared by the method of the current invention (surface magnification factor of 5,000×).
Figure 7:
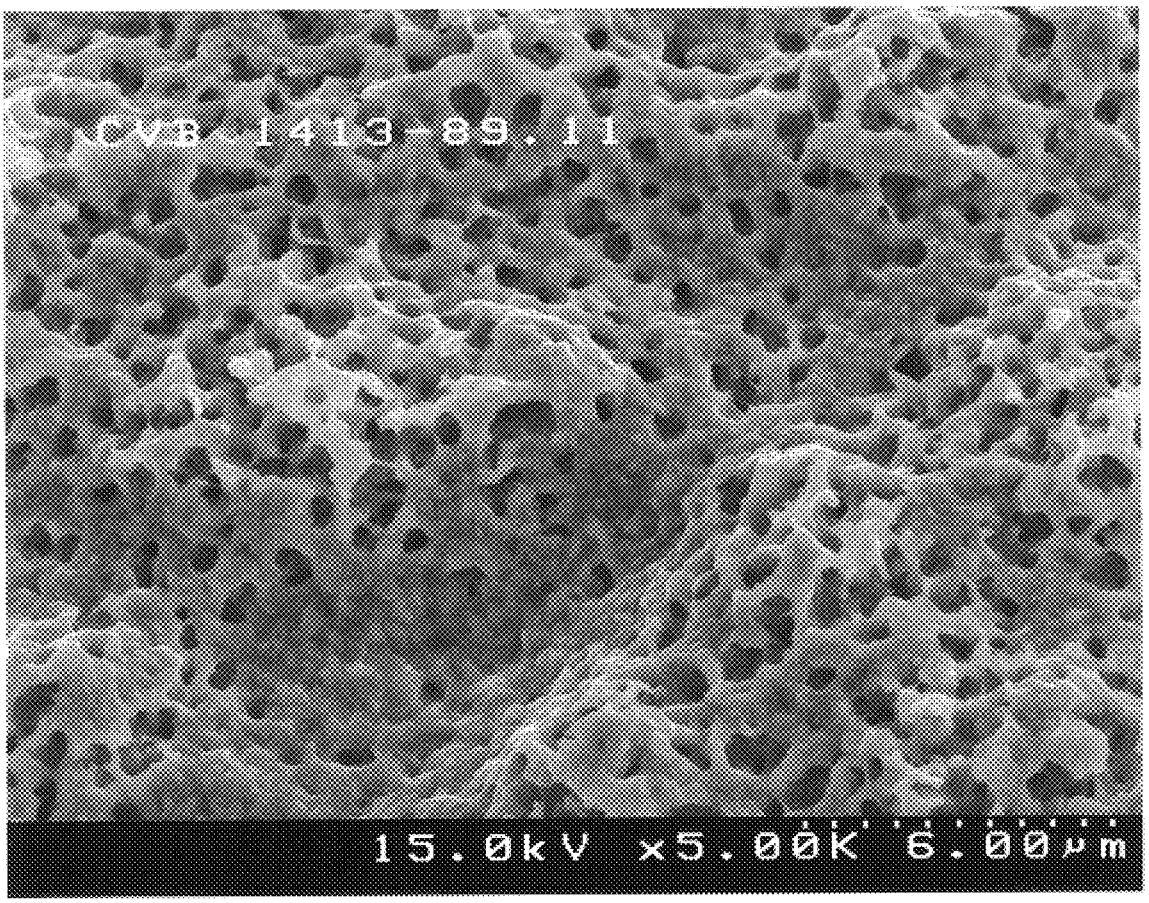

The term cocontinuous bond refers to the structure which results when the treated copper surface is bonded to an organic material. The resulting structure is cocontinuous because neither the organic material nor the copper surface are discontinuous. The treated copper surface has interconnected channels and depressions. The organic material then flows into the channels and depressions. In the resulting bond, neither the copper surface nor the organic material are discontinuous. The term is also described in relation to polymer networks in U.S. Pat. No. 5,266,610.

The passages of the interconnected channels have a diameter which is typically an average of less than about 20, or less than about 15, or less than about 10 microns. Preferably from about 50% to about 100% of the passages have an average diameter from about 1 to about 8 microns. The surface structure, e.g., the channels or depressions occur to a depth up to about 75, generally from about 1 to about 65, or from about 5 to about 50 microns. Here as well elsewhere in the specification and claims, the range and ratio limits may be combined. The channels and/or depressions may form several layers with multiple application of the etching compositions. Each layer is prepared with each successive treatment of the etching composition. Generally, the copper or copper alloy substrate has from one to about ten, or from about two to about nine, or from about three to about eight layers. The surface structure forms an open cellular network.

As described above, the present invention relates to a method of producing copper substrates with improved bonding. The substrate may be a copper or copper alloy substrate. The copper or copper alloy may be a solid block or foil supported on a dielectric substrate. The foils are those know to those in the art.

The organic materials may be any organic materials which may be bounded to metal substrates. For instance, the organic material may be Teflon or organic prepregs, organic adhesives, natural or synthetic elastomers, or insulating materials for making printed circuit boards. The prepregs include FR-4, FR-10, G-10, polyimide, bis-maleimide triazine resin, polyvinyl fluorides and cyanate esters, and are known to those in the art.

The method for preparing the micropores, involves applying an etching composition to a copper or copper alloy substrate. The etching composition contains (a) an acid, (b) an oxidizing agent, (c) a copper complexing agent, and (d) a copper complex.

Acid

The acid may be any acid or mixture of acids which is strong enough to etch the copper or copper alloy in the presence of the other ingredients of the etching composition to form micropores. The amount of acid contained in the etching composition may vary from about 2% to about 75%, or from about 4% to about 58%, or from about 5% to about 20% by weight. In another embodiment, the acid is present in an amount from about 20 to about 400, or from about 80 to about 200 grams of acid per liter of solution. Sufficient acid is present in the etching composition to provide a pH from 0 to about 5, or from 0 to about 3, more often from 0 to about 2. Generally, it is desirable to use an acid that has an anion common to the acid salts of the metals.

The acid is usually a mineral acid, alkane sulfonic acid, alkanol sulfonic acid, or mixtures thereof. Example of useful mineral acids include sulfuric acid, perchloric acid, hydrochloric acid, fluoroboric acid, phosphoric acid, etc.

The alkane sulfonic acids may be represented by the following formula, R—SO$_3$H, wherein R is an alkyl group containing from about 1 to about 18, or from about 1 to about 12 carbon atoms. Examples of alkane sulfonic acids include, for example, methane sulfonic acid, ethane sulfonic acid, propane sulfonic acid, butane sulfonic acid, pentane sulfonic acid, hexane sulfonic acid, decane sulfonic acid and dodecane sulfonic acid.

The alkanol sulfonic acids may be represented by the following formula: $(C_nH_{2n+1})$—CH(OH)—$(CH_2)_m$—SO$_3$H wherein n is from 0 to about 10, m is from 1 to about 11 and the sum of m+n is from 1 up to about 12. The hydroxy group of the alkanol sulfonic acids may be a terminal or internal hydroxy group. Examples of useful alkanol sulfonic acids include hydroxyethyl sulfonic acid, hydroxypropyl sulfonic acid, hydroxybutyl sulfonic acid, hydroxypentyl sulfonic acid, hydroxyhexyl sulfonic acid, and hydroxydodecyl sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula $R_1S_nR_2$ wherein $R_1$ or $R_2$ are alkyl groups having from 1 to about 18 carbon atoms and n is a positive integer between 1 and 6. The metal salts of such acids are prepared, for example, by dissolving a metal oxide in a hot concentrated aqueous solution of an alkane or alkanol sulfonic acid.

Oxidizing Agent

The second component of the etching composition is an oxidizing agent. The oxidizing agent is generally present in an amount sufficient to promote formation of above described surface structure. Typically the oxidizing agent is present in an amount from about 0.0001% up to about 10%, or from about 0.01% up to about 5%, or from about 0.1% up to about 2% by weight. The dissolved air and oxygen are present in an amount to promote formation of the above described surface structure. The oxidizing agents include dissolved air, oxygen, peroxides, persulfates, peroxysulfates, permanganates, chromic acid, soluble metal ions from Groups IIIB, IVB, VB, and mixtures of two or more oxidizing agents. The peroxides may be hydroperoxides and/or di-organo peroxides. The peroxides include hydrogen peroxide and organic peroxides. The preferred organic peroxides are those having organic groups, e.g., alkyl or aryl groups, containing from two to about twenty, preferably from about two to about twelve carbon atoms. Examples of organic peroxides include tert-butyl peroxide, tert-amyl peroxide, benzoyl peroxide, etc.

The oxidizing agent may be a metal from Groups IIIB, IVB, and/or VB. Examples of these metal include tin, lead, bismuth, gallium and indium. The metal is in the form of a solution soluble salt such as a salt of the acids or complexing agents above.

Complexing Agent

Along with the acid and the oxidizing agent, the etching composition contains a copper complexing agent. The amount of complexing agents included in the etching compositions is from about 0.5% to about 20%, or from about 1% to about 15%, or from about 2% to about 10% by weight. When the solubility of the complexing agent is low, a cosolvent may be added to solubilize the complexing agent and thereby enhance its activity in the resulting solution. Suitable cosolvents include water-miscible solvents such as alcohols (e.g., ethanol), glycols (e.g., ethylene glycol), alkoxy alkanols (2-butoxy ethanol), ketones (e.g., acetone), aprotic solvents (e.g., dimethylformamide, dimethylsulfoxide, acetonitrile, etc.), etc.

The copper complexing agent include ureas, including thioureas, io imidazole-thiones, and mixtures thereof and derivatives, homologs, and analogs thereof. Specific examples of copper complexing agents include urea nitrate, urea oxalate, 1-acetylurea, 1-benzylurea, 1-butylurea, 1,1-diethylurea, 1,1-diphenylurea, 1-hydroxyurea, thiourea, etc. Examples of useful urea derivatives are found in Holtzman et al, U.S. Pat. No. 4,657,632, which is incorporated herein by reference.

The imidazole-thiones include imidazole-2-thione which is represented by the formula compound

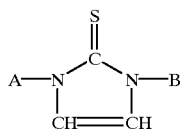

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety.

In one embodiment, the complexing agent is a 1,3-dialkylimidazole-2-thione compound (where A and B are each individually alkyl or cycloalkyl groups), and the thione compound may be unsymmetrical (A and B are different) or symmetrical (A and B are the same). Preferably, the complexing agents are unsymmetrical such as (where A is methyl or ethyl and B is an alkyl or cycloalkyl group containing from 3 to 6 carbon atoms). Preferably, when A is methyl, B is a $C_3$–$C_6$ alkyl or cycloalkyl group, and when A is ethyl, B is a $C_4$–$C_6$ alkyl or cycloalkyl group. An example of an unsymmetrical compound is 1-methyl-3-propylimidazole-2-thione.

Alternatively, symmetrical 1,3-dialkylimidazole-2-thione compounds may be used and the dialkyl groups are the same alkyl or cycloalkyl groups containing from 1 to 6 carbon atoms. An example of this class of complexing agents is 1,3-dimethylimidazole-2-thione.

The imidiazole-2-thione complexing agents are described in U.S. Pat. No. 5,554,211, issued to Bokisa et al. This patent is incorporated for its disclosure of the thione as well as immersion metal compositions and methods.

Copper Complex

The etching compositions also include a copper complex. The copper complex is present in an amount sufficient to precipitate when applied to the copper or copper alloy substrate. The copper complex, generally is present in an amount from about 5 grams per liter up to the solubility limit of the copper complex. The amount of copper is expressed as grams per liter or g/l. It is understood here and throughout the specification that the term refers to the amount of metal per liter. For instance, the amount of complexing agent is at least about 5 g/l as copper metal. In one embodiment, the copper complex is present in an amount from about 5 up to about 75, or from about 15 to about 60 or from about 20 to about 40 grams per liter as copper. The copper complex includes copper complexes of the above-identified complexing agents or a combination of the above complexing agents with one of the above acids. In a preferred embodiment, the copper complex is a copper thiourea or a copper imidiazole-2-thione.

The etching composition may include one or more surfactants compatible with each of the metal salts, the acids and the complexing agent. The etching composition may optionally contain at least one surfactant in a concentration from about 0.01 to about 100 grams per liter of bath and more preferably from about 0.05 to about 20 grams per liter of bath. The surfactant may be at least one surfactant including amphoteric, nonionic, cationic, or anionic surfactants; or mixtures thereof. More often, the surfactant is at least one cationic or anionic surfactant; or mixtures thereof. The nonionic surfactants are preferred.

A variety of nonionic surfactants include the condensation products of ethylene oxide and/or propylene oxide with compounds containing a hydroxy, mercapto or amino group. Examples of materials containing hydroxyl groups include alkyl phenols, styrenated phenols, fatty alcohols, fatty acids, polyalkylene glycols, etc. Examples of materials containing amino groups include alkylamines and polyamines, fatty acid amides, etc.

Examples of nonionic surfactants include ether containing surfactants which may be produced by treating fatty alcohols or alkyl or alkoxy substituted phenols or naphthols with excess ethylene oxide or propylene oxide. The alkyl group may contain from about 14 to about 24 carbon atoms and may be derived from a long chain fatty alcohol, such as oleyl alcohol or stearyl alcohol.

Nonionic polyoxyethylene compounds are described in U.S. Pat. No. 3,855,085, which is incorporated by reference. Polyoxyethylene compounds are available commercially under the general trade designations "Surfynol" by Air Products and Chemicals, Inc. of Wayne, Pa., under the designation "Pluronic" or "Tetronic" by BASF Wyandotte Corp. of Wyandotte, Mich., and under the designation "Surfonic" by Huntsmern Corporation of Houston, Tex.

Alkoxylated amine, long chain fatty amine, long chain fatty acid, alkanol amines, diamines, amides, alkanol amides and polyglycol type surfactants known in the art are also useful. One type of amine useful surfactant is the group of surfactants obtained by the addition of a mixture of propylene oxide and ethylene oxide to diamines. More specifically, compounds formed by the addition of propylene oxide to ethylene diamine followed by the addition of ethylene oxide are useful and are available commercially from BASF Wyandotte, Ind. Chemical Group under the general trade designation "Tetronic".

Carbowax-type surfactants, which are polyethylene glycols having different molecular weights, also are useful. Other known nonionic glycol derivatives, such as polyalkylene glycol ethers and methoxy polyethylene glycols, are available commercially and may be utilized as surfactants.

Ethylene oxide condensation products with fatty acids also are useful nonionic surfactants. Many of these are available commercially under the general tradename "Ethofat" from Armak Ind. Examples of these surfactants include condensates of coco acids, oleic acid, etc. Ethylene oxide condensates of fatty acid amides, e.g., oleamide, also are available from Armak Ind.

Polyoxyalkylated glycols, phenols and/or naphthols may also be included. Many of these condensates are available commercially under such trade names as "Tween" from ICI America, "Triton" from Rohm & Haas Co., "Tergitol" from Union Carbide, and "Igepal" from General Aniline and Film Corp.

The surfactants utilized in the etching compositions also may be amphoteric surfactants. The preferred amphoteric surfactants include betaines and sulfobetaines, and sulfated or sulfonated adducts of the condensation products of ethylene oxide and/or propylene oxide with an alkyl amine or diamine. Examples of these surfactants include lauryidimethylammonium betaine, stearyl dimethylammonium betaine, a sulfated adduct of an ethoxylated alkylamine, Triton QS-15 (Rohm & Haas Co.), a sodium salt of a sulfonated lauric derivative, Miranol HS, and a sodium salt of a sulfonated oleic acid, Miranol OS.

Cationic surfactants also are useful in the etching compositions and may be selected from higher alkyl amine salts, quaternary ammonium salts, alkyl pyridinium salts and alkyl imidazolium salts. Examples of the above described cationic surfactants, in the form of salts, are lauryltrimethylammonium salt, stearyltrimethylammonium salt, octadecyidimethylethylammonium salt, dimethylbenzyllaurylammonium salt, octadecyidimethylbenzylammonium salt, triethylbenzylammonium salt, laurylpyridinium salt, dodecylpicolinium salt, 1-hydroxyethyl-1-benzyl-2-laurylimidazolinium salt, 1-hydroxyethyl-1-benzyl-2-oleylimidazolinium salt, stearylamine acetate, laurylamine acetate, and octadecylamine acetate.

Cationic surfactants obtained by condensation of various amounts of ethylene oxide or propylene oxide with primary fatty amines are useful and are prepared by condensing various amounts of ethylene oxide with primary fatty amines which may be a single amine or a mixture of amines such as are obtained by the hydrolysis of tallow oils, sperm oils, coconut oils, etc. Specific examples of fatty acid amines containing from 8 to 30 carbon atoms include saturated, as well as unsaturated, aliphatic amines such as octyl amine, decyl amine, lauryl amine, stearyl amine, oleyl amine, myristyl amine, palmityl amine, dodecyl amine, and octadecyl amine. Alkoxylated amines, e.g., coconut fatty amine, stearyl amine, and tallow amine, are available from the Armak Chemical Division of Akzona, Inc., Chicago, Ill., under the general trade designation "Ethomeen". Specific examples of such products include "Ethomeen C/15" "Ethomeen C/20", "C/25", "Ethomeen S/15" and "S/20" and "Ethomeen T/15" and "T/25". Commercially available examples of the alkoxylated diamines include "Ethoduomeen T/13" and "T/20" which are ethylene oxide condensation products of N-tallow trimethylene diamine containing about 3 and 10 moles of ethylene oxide per mole of diamine respectively.

The amine ethoxylate surfactants exhibit the characteristics of both cationic and nonionic surfactants with the nonionic properties increasing at the higher levels of ethoxylation. That is, as the level of ethoxylation increases, the ethoxylated amine behaves more like a nonionic surfactant. Useful surfactants are available commercially such as from Texaco Chemical Company under the trade designation "M-300 Series", such as M-302, M-305, M-31 0, M-315 and M-320 which contain a total to 2, 5, 10, 15 and 20 moles of ethylene oxide respectively.

The surfactants also may be anionic surfactants. Examples of useful anionic surfactants include sulfated alkyl alcohols, sulfated lower ethoxylated alkyl alcohols, and their salts such as alkali metal salts. Examples of such surfactants include sodium lauryl sulfate (Duponol C or QC from DuPont), sodium mixed long chain alcohol sulfates available from DuPont under the designation Duponol WN, sodium octyl sulfate available from Alcolac, Ltd. under the designation Sipex OLS, Sodium tridecyl ether sulfate (Sipex EST), sodium lauryl ether sulfate (Sipon ES), magnesium lauryl sulfate (Sipon LM), the ammonium salt of lauryl sulfate (Sipon L-22), diethanolamino lauryl sulfate (Sipon LD), sodium dodecylbenzene sulfonate (Siponate DS), etc.

The etching compositions may also contain one or more chelating agents. The chelating agents generally comprise the various classes of chelating agents and specific compounds disclosed in Kirk-Othmer, Encyclopedia of Chemical Technology, Third Edition, Vol. 5, pp. 339–368. This disclosure is hereby incorporated by reference. Chelating agents that are especially preferred comprise polyamines, aminocarboxylic acids and hydroxy carboxylic acids. Some aminocarboxylic acids that may be used comprise ethylenediaminetetraacetic acid, hydroxyethylethylenediaminetriacetic acid, nitrilotriacetic acid, N-dihydroxyethylglycine, and ethylenebis (hydroxyphenylglycine). Hydroxy carboxylic acids that may be used comprise tartaric acid, citric acid, gluconic acid and 5-sulfosalicylic acid. Other useful chelating agents include polyamines such as ethylenediamine, dimethylglyoxime, diethylenetriamine, etc.

Various reducing agents that may be included in the etching compositions, and these generally comprise organic aldehydes whether saturated or unsaturated, aliphatic or cyclic, having up to about 10 carbon atoms. Glucose has been found to prevent oxidation of the metal salts to a higher oxidation state, e.g., tin (II) ion to tin (IV) ion, but also as a chelating agent and is especially useful for these reasons. Other useful reducing agents include hypophosphorous acid, dimethylamino borane, etc.

Method

The present method involves the formation of a copper or copper alloy substrate capable of forming a cocontinuous bond by an etching composition. The application of the composition may be accomplished by immersion of the substrate or spraying the etching composition on the substrate. Single jet, fan or cone nozzles may be used in the spray application. The immersion method of applying the etching composition is generally in an aerated or agitated dip tank. Additionally, fluid head methods and ram jet methods may be used to apply the etching composition as is known to those in the art. The time of spraying is long enough for the formation of the above described surface structure. Generally, the spraying is accomplished in about 0.1 to about 5, or from about 0.25 to about 3, or from about 0.5 to about 2 minutes.

Generally speaking, the etching composition is maintained at a temperature higher than the temperature of the substrate. In one embodiment, the etching composition is maintained at a temperature from about 40° F. to 150° F., or from about 60° F. to 130° F., or from about 80° F. to about 120° F. When the copper complex which is in a warm composition is applied to a cooler substrate, the copper complex precipitates.

The copper or copper alloy substrate with the above described surface structure may be used in a variety of applications where improved bonding between organic materials and copper or copper alloy surfaces are desired. For instance, the substrate may be (1) treated with a metal coating composition, a silane coating composition, and/or a metal stripping composition, (2) treated with vulcanizable adhesive, (3) treated with photoimageable, coating element, (4) treated to form a copper oxide coating, and (5) treated to form a reduced copper oxide coating. The copper or copper alloy substrate may also be metal used in preparation of tires, reinforced tubing or other metal reinforced rubber products. The metal reinforcement may be the copper or copper alloy substrate. The copper or copper alloy substrate may be a coating on other metals used in metal reinforced rubber products. The copper or copper alloy substrate may be infiltrated with ceramic material to form a cocontinuous structure and used where better ceramic and metal bonding is desired. The copper or copper alloy substrate may also be used in improved bonding in brake pads.

Metal Coating Composition

In one embodiment, the method involves the step of treating the substrate with a metal coating composition, e.g., an electroless metal coating composition. The metal coating composition is typically an immersion metal coating composition. The metal coating compositions are those used to form metal oxide/hydroxide layers on copper or copper alloys. The metal coating composition comprises (1) at least one solution soluble metal salt, (2) an acid, such as those disclosed above, (3) a complexing agent, such as those disclosed above, and (4) water. The metals of the metal coating composition include bismuth, galium, germanium, gold, indium, lead, palladium, silver, tin and alloys of these metals.

The metal coating composition generally contains from about 1 to 100, or from about 2 to about 50, or from about 5 to about 30 g/l of metal as the metal salt. The acid is present in an amount from about 1% to about 30%, or from about 5% to about 20% by weight. The amount of complexing agent included in the metal coating compositions may range from about 5 grams per liter up to the solubility limit of the complexing agent in the plating solution. Generally, the coating composition will contain from about 5 to about 100 grams of complexing agent per liter, and more often from about 40 to about 80 grams per liter. When the solubility of the complexing agent is low, a cosolvent may be used as discussed above.

The metal coating compositions also may contain one or more of the above surfactants, chelating agents or reducing agents disclosed above.

The metal coating compositions are described in U.S. Pat. Nos. 4,715,894, and 4,882,202 issued to Holtzman et al, U.S. Pat. No. 4,871,429, issued to Nobel et al, U.S. Pat. No. 5,073,456, issued to Palladino, and U.S. Pat. No. 5,554,211, issued to Bokisa et al. These patents are incorporated by reference for their disclosure of metal coatings and methods of using the same.

Silane Coating

In another embodiment of the present invention, the copper or copper alloy substrate having the above described surface structure may be treated with a silane coating composition. The silane coating composition may be (a) applied directly to the copper or copper alloy substrate or (b) applied to the metal oxide/hydroxide layer on the copper or copper alloy substrate formed from the metal coating composition, i.e. the immersion metal coating, described above. An organosilane composition is used to bond the metal oxide, metal hydroxide, or combination thereof to one or more insulating layers. The organosilane may be placed on the metal oxide, metal hydroxide or combination thereof or an insulating layer.

The silane coating composition comprises a mixture of (i) at least one silane coupling agent and (ii) at least one member selected from the group consisting of a tris (silylorgano) amine, a tris(silylorgano)alkane, a disysyl compound and a non-epoxy hydrolyzable silane containing a heterocyclic, acryloxy, amide, or carbon-carbon double bond containing group. In one embodiment, the organosilane compositions comprise (i) a mixture of at least one silane coupling agent and (ii) a tris(silylorgano)amine or alkane, as described below. In another embodiment, the organosilane composition comprises (i) a mixture of an ureido silane and (ii) a disylyl compound, as described hereinafter.

Silane coupling agents are well known, and various conventional silane coupling agents may be utilized. Examples of silane coupling agents include silane esters, amino silanes, amido silanes, ureido silanes, halo silanes, epoxy silanes, vinyl silanes, methacryloxy silanes, mercapto silanes, and isocyanato silanes. The alkyl and aryl groups may contain up to about 10 carbon atoms. Alkyl groups containing from 1 to about 5 carbon atoms are particularly useful. In one embodiment, n is an integer from 0 to 10 and more often from 1 to about 5.

Specific examples of silane coupling agents useful in the first embodiment of the present invention include N-(2-aminoethyl)-3-aminopropyltrimethoxysilane, 3-methacryloxypropyltrimethoxysilane, 3-(2-(vinylbenzylamino)ethylamino)-propyltrimethoxysilane, 3-glycidoxypropyltrimethoxysilane, triacetoxyvinylsilane, tris-(2-methoxyethoxy)-vinylsilane, 3-chloropropyltrimethoxysilane, 1-trimethoxysilyl-2-(p,m-chloromethyl)phenylethane, 3-chloropropyltriethoxysilane, N-(aminoethylaminomethyl)phenyltrimethoxysilane, N-(2-aminoethyl)-3-aminopropyl tris(2-ethylhexoxy)silane, 3-aminopropyltrimethoxysilane, trimethoxysilylpropylenetriamine, β(3,4-epoxycyclohexyl)ethyltrimethoxysilane, 3-mercaptopropyltrimethoxysilane, 3-mercaptotriethoxysilane, 3-mercaptopropylmethyidimethoxysilane, bis(2-hydroxyethyl)-3-aminopropyltrimethoxysilane, 1,3-divinyltetramethyldisilazane, vinyltrimethoxysilane, 2-(diphenylphosphino)ethyltriethoxysilane, 2-methacryloxyethyidimethyl[3-trimethoxysilylpropyl]ammonium chloride, 3-isocyanatopropyidimethylethoxysilane, N-(3-acryloxy-2-hydroxypropyl)-3-aminopropyltriethoxysilane, vinyl tris(t-butylperoxy)silane, methyltrimethoxysilane, ethyltrimethoxysilane, phenyltrimethoxysilane, phenyltriacetoxysilane, methyltrimethoxysilane, phenyltrimethoxysilane.

The preferred silane coupling agents are those which are commercially available and which are recognized by those skilled in the art as being effective coupling agents. A number of organofunctional silanes are available, for example, from Union Carbide, Specialty Chemicals Division, Danbury, Connecticut. Examples of useful silane coupling agents available from Union Carbide are summarized in the following table.

TABLE I

Silane Coupling Agents

| Type | Trade Designation | Formula |
|---|---|---|
| Esters | A-137 | $(EtO)_3SiC_8H_{17}$ |
| | A-162 | $(EtO)_3SiCH_3$ |
| Amino | A-1100 | $(EtO)_3Si(CH_2)_3NH_2$ |
| | A-1110 | $(MeO)_3Si(CH_2)_3NH_2$ |
| | A-1120 | $(MeO)_3Si(CH_2)_3NH(CH_2)_2NH_2$ |
| | A-1130 | $(MeO)_3Si(CH_2)_3NH(CH_2)_2NH(CH_2)_2NH_2$ |
| Ureido | A-1160* | $(EtO)_3Si(CH_2)_3NHC(O)NH_2$ |
| Isocyanato | A-1310 | $(EtO)_3Si(CH_2)_3N=C=O$ |
| Vinyl | A-151 | $(EtO)_3SiCH=CH_2$ |

TABLE I-continued

Silane Coupling Agents

| Type | Trade Designation | Formula |
|---|---|---|
| | A-171 | $(MeO)_3SiCH=CH_2$ |
| | A-172 | $(CH_3OC_2H_4O)_3SiCH=CH_2$ |
| Methacryloxy | A-174 | $(MeO)_3Si(CH_2)_3OC(O)C(CH_3)=CH_2$ |
| Epoxy | A-187 |  |
| Mercapto | A-189 | $(MeO)_3Si(CH_2)_3SH$ |

*50% w/w in methanol

In one embodiment, the silane coupling agent is a ureido silane represented by the formula

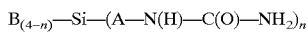

wherein A is an alkylene group containing from 1 to about 8 carbon atoms, B is a hydroxy or alkoxy group containing from 1 to about 8 carbon atoms and n is an integer from 1 to 3 provided that if n is 1 or 2, each B may be the same or different. In one embodiment, each B is an alkoxy group containing 1 to about 5 carbon atoms, particularly methyloxy or ethyloxy groups, and A is a divalent hydrocarbyl group containing from 1 to about 5 carbon atoms. Examples of such divalent hydrocarbyl groups include methylene, ethylene, propylene, butylene, etc. Specific examples of such ureido silanes include β-ureidoethyl-trimethoxysilane; β-ureidoethyl-triethoxysilane; γ-ureidoethyl-trimethoxysilane; γ-ureidopropyl-triethoxysilane, etc.

The second component in the organosilane compositions useful in the present invention is (1) a tris(silylorgano)amine characterized by the formula

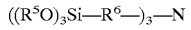

or (2) a tris(silylorgano)alkane characterized by the formula

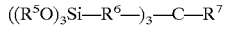

or, (3) a disylyl compound of the formula

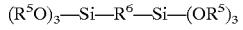

wherein each $R^5$ is independently an alkyl, alkoxyalkyl, aryl, aralkyl or cycloalkyl group of less than 20 carbon atoms; $R^6$ is a divalent hydrocarbon or polyether group of less than 20 carbon atoms; and $R^7$ is a functional group represented by $C_nH_{2n}X$, wherein n is from 0 to 20, and X is selected from the group consisting of amino, amido, hydroxy, alkoxy, halo, mercapto, carboxy, acyl, vinyl, allyl, styryl, epoxy, isocyanato, glycidoxy, and acryloxy groups. In one embodiment, each $R^5$ group is independently an alkyl, alkoxy alkyl, aryl, aralkyl or cycloalkyl group of less than 10 carbon atoms and is more often an alkyl group containing from 1 to 5 carbon atoms or an alkoxy alkyl group containing from 2 to 10 carbon atoms. $R^6$ is a divalent hydrocarbon or divalent polyether group containing less than 20, or up to about 8 carbon atoms. $R^6$ can be, for example, alkylene groups such as methylene, ethylene, propylene, ethylidene and isopropylidene; cycloalkylenes such as cycloheptylene and cyclohexylene; divalent aromatic groups such as phenylene, tolylene, xylylene, and naphthalene; and divalent groups of aralkanes of the formula, —$C_6H_4$—R'—, wherein R' is an alkylene group such as methylene, ethylene or propylene. $R^6$ also can be, for example, a divalent polyether of the formula —$R^8$—(O—$R^8$)$_z$—, wherein $R^8$ is an alkylene group and z is an integer of from 1 to about 5. The divalent polyether group can be, for example, diethylene ether. In one embodiment, $R^7$ is defined the same as Group B above, where group B is a functional group.

The tris (silylorgano)amines which are useful in the silane compositions are known compounds, and procedures for preparing such tris (silylorgano)amines have been described in, for example, U.S. Pat. Nos. 5,101,055; 2,920,095; and 2,832,754; and the disclosures of these patents with regard to the tris (silylorgano)amines and methods for preparing such amines are hereby incorporated by reference.

Specific examples of tris(silylorgano)amines which are useful in the silane compositions include tris (trimethoxysilylmethyl)amine; tris (triethoxysilylmethyl) amine; tris (trimethoxysilylethyl)amine; tris (trimethoxysilylethyl)amine; tris (trimethoxysilylethyl) amine; tris (triethoxysilylpropyl)amine; tris (dimethoxyethoxysilylpropyl)amine; tris (tripropoxysilylpropyl)amine; etc.

As described in U.S. Pat. No. 5,101,055, the tris (silylorgano)amines may be prepared from the corresponding bis-amine by contacting the bis-amine with particulate palladium monoxide at a temperature within the range of from about 50° C. to 300° C. Another procedure for preparing the tris (silylorgano)amine compounds utilizes the reaction of the bis (trialkoxysilylalkyl)amine with an equimolar amount of a trialkylsilyipropyl halide, such as the chloride. For example, tris (trimethoxysilylpropyl)amine can be prepared by reacting bis (trimethoxysilylpropyl) amine with trimethoxysilylpropyl chloride. This process is a modification of the process described in U.S. Pat. No. 4,775,415 used for preparing bis (trimethoxysilylpropyl) amine from 3-aminopropyltrimethoxysilane and 3-chloro propyltrimethoxy silane.

In another embodiment, the silane composition includes a disylyl compound, such as those represented by the above formula.

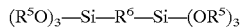

wherein $R^5$ and $R^6$ are defined above. Examples of these materials include bis (trimethoxysilyl) ethane, bis (triethoxysilyl) ethane, hexamethoxy disilylethane, etc. The disylyl compounds may be made by means known to those in the art. For instance, the disylyl compounds may be prepared by reacting a chloroalkyltrialkyoxysilane with a tetraalkoxysilane. U.S. Pat. No. 4,689,085, issued to Plueddemann, describes disylyl compounds and methods of their preparation. This patent is incorporated by reference for such disclosure.

The amounts of the silane coupling agent (i) and the tris (silylorgano)amine or alkane or disylyl compound (ii) utilized in the silane compositions may vary over a wide range. For example, the weight ratio of the silane-coupling agent (i) to the tris (silylorgano)amine or alkane or disylyl compound (ii) may range from about 1:99 and about 99:1. More often, the ratio, expressed as a mole ratio of (i):(ii), is in the range from about 1:1 to about 5:1.

In another embodiment, the silane compositions include a non-epoxy group containing hydrolyzable silane possessing a heterocyclic, such as an imidazole or pyrrole; acryloxy; amide; or carbon-carbon double bond containing group, such as styryl. These silanes are used in combination with one or more of the above described alkoxy, alkyl or epoxy containing silanes. The non-epoxy group containing silane is represented by the formula

wherein a is 1 or 2, X is a hydrolyzable group, R is a hydrocarbon group and Y is a functional group containing an activated double bond selected from the group consisting of heterocyclic, acryloxy, amide and a carbon carbon double bond containing group, with the proviso that X and Y are not epoxy-containing groups.

Hydrolyzable groups, which may contain from 1 to about 8 carbon atoms, preferably contain 1 to about 4 carbon atoms. Hydrolyzable groups also include halogens. For example, X includes hydrocarbyloxy and alkoxy groups, such as methoxy, ethoxy, propyloxy and butoxy groups, as well as chlorine, bromine, and iodine. Hydrocarbon groups include alkyl, alkenyl, or any other group substantially containing carbon and hydrogen atoms. In one embodiment, R is an alkyl group containing 1 to about 5 carbon atoms. In another embodiment, R is an alkyl group containing 1 to about 3 carbon atoms. In another embodiment, the silane is characterized by the absence of free amino groups.

Y is a functional group which must be compatible with the curing mechanism of the prepreg resin. Y is therefore selected from heterocyclic groups, acryloxy groups, amide groups and carbon carbon double bond containing groups. Examples of heterocyclic groups include substituted and unsubstituted pyrroles, pyrazoles, imidazoles, pyrrolidines, pyridines, pyrimidines, oxazoles, thiazoles, furans, thiophenes. Preferably, nitrogen containing heterocyclic groups are used. Preferably, heterocyclic groups having some degree of unsaturation are used. Examples of acryloxy groups include acryloxy, alkylacryloxy groups such as methacryloxy, and the like. Examples of carbon carbon double bond containing groups include alkenyl, cyclopentadienyl, styryl and phenyl.

Examples of such silanes include N-(3-trimethoxysilylpropyl)pyrrole, N-[3-(triethoxysilyl)propyl]-4,5-dihydroimidazole, β-trimethoxysilylethyl-2-pyridine, N-phenylaminopropyltrimethoxysilane, 3-(N-styrylmethyl-2-aminoethylamino)propyltrimethoxysilane, methacryloxypropenyltrimethoxysilane, 3-methacryloxypropyl trimethoxysilane, 3-methacryloxypropyl tris (methoxyethoxy)silane, 3-cyclopentadienyl propyltriethoxysilane, 7-oct-1-enyltrimethoxysilane, Prosil® 9214 from PCR, Inc. (a carboxy amide silane), and the like. Silanes such as N-[3-(triethoxysilyl)propyl]-4,5-dihydroimidazole and 3-methacryloxypropyl trimethoxysilane are preferred. The non-epoxy containing silane and their means of preparation are described in U.S. Pat. No. 5,614,324, which is incorporated by reference for those disclosures.

The silane compositions may comprise other materials such as solvents, fillers, etc. Solvents should be capable of solubilizing both the silane coupling agent and the tris (silylorgano)amino or alkane or disylyl compound. Typically, such solvents include lower alcohols such as methanol, butanol or isopropanol. Water, or mixtures of water and alcohols can also be used as a solvent, but the stability of such solutions is generally more limited than the solutions made with alcohols. Small portions of water can be added to the silane compositions in order to hydrolyze the conventional silane coupling agent (A) and the tris (organosilyl)amine or alkane or disylyl compound. Alternatively, dispersions or emulsions of the silane compositions can be prepared in suitable organic solvent or mixtures of water and organic solvent. Typical solvents include, in addition to the alcohols described above, ethers, ketones, aliphatic and aromatic hydrocarbons, amides such as N,N-dimethylformamide, etc. Aqueous emulsions of the silane-coupling agents can be prepared in the conventional manner using conventional dispersants and surfactants, including nonionic surfactants. The solids content of the silane compositions may vary from 100% by weight in pure mixtures to as little as 0.1 weight percent or less in very dilute solutions or emulsions. More often, the solids content of solutions will be between about 0.5% and about 5% by weight.

Metal Stripper

In another embodiment, the copper or copper alloy substrate is treated with a metal stripper. The metal stripper is applied by immersion or spraying, as discussed above. The metal stripper composition may be applied to the copper or copper alloy substrate or the metal oxide/hydroxide layer formed from the metal coating composition. The metal stripper is added in an amount to remove some of the copper complex which deposits upon treatment with the etching composition. The metal stripper may be any combination useful in stripping metal as is known to those in the art.

Examples of useful metal strippers are inhibited acid or cyanide solutions. The acids include sulfuric and sulfonic acids and other mineral acids useful in metal stripping compositions. The cyanide stripper compositions include alkali or alkaline earth metal or ammonium cyanide stripping compositions known to those in the art. The inhibited compositions typically are inhibited by nitrocompounds. Examples of useful inhibiting compounds include nitrobenzenes, nitrobenzoic acids, nitroanilines, nitrophenols, nitrosulfonic acids, nitrobenzaldehydes, nitroparafins and nitroalkanes. The metal stripping compositions are known to those in the art and described in U.S. Pat. Nos. 2,649,361, 2,698,781 and 2,937,940, the disclosures of which are incorporated by reference. Metal stripping compositions are available commercially. Examples of metal stripping compositions are Rostrip M-20 and M-50 available commercially from McGean Rohco, Inc.

Vulcanizable adhesive

In another embodiment, the copper or copper alloy substrate with the surface structure described herein is treated with a vulcanizable adhesive which is crosslinked by chemical bonding through sulfur atoms. The adhesive contains chemicals having a vulcanizable unsaturated bond and at least one type of vulcanizing agent selected from sulfur, an organic sulfur donor and an organic thiol. The chemicals having vulcanizable unsaturated bonds include monomer, oligomers, polymers or elastomers having vulcanizable unsaturated bonding such as unsaturated rubbers, including styrene butadiene rubbers, nitrile butadiene rubbers, isoprene rubbers, fluorocarbon rubbers, butyl rubbers, and natural rubbers; ethylene alpha-olefin copolymer elastomers prepared with a diene, including ethylene propylene diene terpolymers and ethylene butene diene terpolymers; unsaturated polyester resins based on maleic anhydride, fumaric acid, itaconic acid and citraconic acids; unsaturated epoxy acrylate resins; maleimides; etc. The vulcanizable rubber is cured with the vulcanizing agent to improve adhesion to copper laminates. The process, vulcanizable chemicals, vulcanizing agents, and additional chemicals used in this process are described in U.S. Pat. No. 5,569,545, issued to Yokono et al, whose disclosure is hereby incorporated by reference.

Photoimageable Permanent Coating

In another embodiment, the copper or copper alloy substrate with the surface structure described herein is treated with an aqueous processable, multilayer, photoimageable, permanent coating element described in U.S. Pat. No. 5,643,657, issued to Dueber et al. This patent is incorporated by reference for its disclosed of the coating elements, and methods and ingredients for making the coating element.

The photoimageable coating element has two layers. The first layer of a photoimageable permanent coating composition comprises: (i) an amphoteric binder; (ii) a carboxyl group containing copolymer binder of the formula

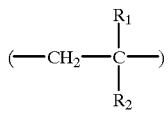

wherein $R_1$ is H or alkyl; $R_2$ is phenyl or —$CO_2R_3$; and $R_3$ is H or alkyl which is unsubstituted or substituted with one or more hydroxy groups; (iii) a monomer component containing at least two ethylenically unsaturated groups; and (iv) a photoinitiator or photoinitiator system.

The second layer of a photoimageable permanent coating composition comprises: (i) a cobinder system comprising at least one low molecular weight copolymer binder component having a molecular weight of from 3,000 to 15,000 and containing from 2% to 50% by weight of at least one carboxylic acid containing structural unit and from 50% to 98% by weight of at least one structural unit of the formula

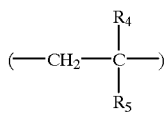

wherein $R_4$ is H, alkyl, phenyl or aryl; R. is H, $CH_3$, phenyl, aryl, —$COOR_6$, —$CONR_7R_8$ or —CN; and $R_6$, $R_7$ and $R_8$ independently are H, alkyl or aryl, which is unsubstituted or substituted with one or more hydroxy, ester, keto, ether or thioether groups; and at least one high molecular weight carboxylic acid containing copolymer binder component having a molecular weight of from 40,000 to 500,000 and containing structural units of the formula

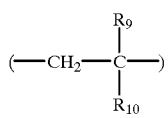

wherein $R_9$ is H, alkyl, —CN, phenyl, alkyphenyl or aryl; $R_{10}$ is phenyl, alkylphenyl, aryl, —$COOR_{11}$ or —$CONR_7R_8$; $R_{11}$ is H or alkyl; and wherein alkyl contains from 1 to 8 carbon atoms; (ii) an acrylated urethane monomeric component; (iii) a photoinitiator or a photoinitiator system; and (iv) a blocked polyisocyanate crosslinking agent.

Preferably, the first layer is applied by conventional means to the temporary support film from a solution and then dried. The second layer of photoimageable permanent coating may be applied as a solution or a preformed layer to the exposed surface of the first layer by conventional means to obtain high adhesion between these two layers.

The first and second layers are developable with about the same concentration of aqueous alkaline solution, such as 1% sodium or potassium carbonate in less than 5 minutes at 40° C., so that the entire thickness of the first and second layers can be washed away in a single development step to leave a resist image of both layers on the substrate surface.

The combined thickness of the photoimageable layers depends on the relief pattern on the surface of the circuit substrate. Generally, the total thickness will be no greater than 125 microns (5 mils). When the permanent coating composition is used in vacuum or roll lamination, the total thickness will generally be no greater than 76 microns (3 mils). Normally, the first layer will comprise from 0.1 to 30%, preferably from 1 to 10%, of the combined layer thickness.

The first layer of photoimageable permanent coating, preferably, contains from 5 to 25 parts by weight of amphoteric binder, from 30 to 80 parts by weight of carboxyl containing copolymer binder, from 5 to 30 parts by weight of an ethylenically unsaturated monomer; and from 0.5 to 10 parts by weight of a photoinitiator or photoinitiator system.

The second layer of photoimageable permanent coating, preferably, contains from 20 to 80 parts by weight of a cobinder system comprising a low molecular weight copolymer component having carboxylic acid functionality and a high molecular weight carboxylic acid containing copolymer, from 10 to 40 parts by weight of an acrylated urethane monomer component; from 0.5 to 10 parts by weight of a photoinitiator or photoinitiator system; and from 5 to 25 parts by weight of a blocked polyisocyanate crosslinking agent.

The amphoteric polymers of the first layer of the photoimageable compositions are copolymers derived from the copolymerization of (1) at least one basic comonomer which is an acrylic or methacrylic acrylamide or methacrylamide, an aminoalkyl acrylate or methacrylate or mixture of any of these; (2) at least one acidic comonomer containing one or more carboxyl groups and (3) at least one further comonomer which is acrylic or methacrylic in character.

The acrylamide and methacrylamide comonomers include N—$C_{1-12}$ alkyl acrylamides or methacrylamides, such as N-butyl and N-octyl acrylamide or methacrylamide. Suitable acidic comonomers for the amphoteric polymers are those having at least one available carboxylic acid group. These include acrylic acid, methacrylic acid, crotonic acid, itaconic acid, maleic acid, fumaric acid and the $C_1$–$C_4$ alkyl half esters of maleic and fumaric acids, such as methyl hydrogen maleate and butyl hydrogen fumarate as well as any other acidic monomers which are capable of being copolymerized with the particular copolymer system. The amphoteric polymer may also be derived from $C_{1-12}$ alkyl, hydroxyalkyl or N-alkyl acrylates or methacrylates; diacetone acrylamide; vinyl esters, e.g., vinyl acetate; and styrene monomers such as styrene and alpha-methyl stryrene.

Suitable comonomers which form the structural unit of the carboxyl containing copolymer binder include styrene and unsaturated carboxylic acids and their derivatives, such as (meth) acrylic acid and (meth) acrylates. The comonomers include methylethyl butyl, 2-hydroxyethyl acrylate and methacrylate.

The unsaturated monomer in the first layer include acrylate and methacrylate derivatives of alcohols, isocyanate, esters, epoxides and the like. Examples are diethylene glycol diacrylate, trimethyolpropane triacrylate, pentaerythritol triacrylate, polyoxyethylated and polyoxypropylated trimethyolpropane triacrylate and trimethacrylate, and similar compounds as disclosed in U.S. Pat. No. 3,380,831, di-(3-methacryloxy-2-hydroxypropyl) ether of tetrachloro bisphenol-A, di-(2-methacryloxyethyl) ether of tetrachloro bisphenol-A, di-(3-methacryloxy-2-hydroxypropyl) ether of tetrabromobisphenol- A, di(2-methacryloxyethyl) ether of tetrabromo-bisphenol-A, triethyleneglycol dimethacrylate, trimethylol propane triacrylate, polycaprolactone diacrylate, and aliphatic and aromatic urethane oligomeric di(meth) acrylates from Sartomer, West Chester, Pa. and Ebecryl® 6700 available from UCB Chemicals, Smyrna, Ga.

The second layer of the photoimageable coating is derived from (i) a cobinder, (ii) an acrylated urethane, (iii) a photoinitiator and (iv) a blocked polyisocyanate. The cobinder is derived from .a low molecular weigh copolymer having a molecular weight from 3,000 to 15,000 and a high molecular weight copolymer having a molecular weight from 40,000 to 500,000.

The low molecular weight copolymer is derived from a unsaturated carboxylic acid or precursor and a comonomer. Examples of suitable ethylenically unsaturated carboxylic acid or carboxylic acid precursor comonomers include acrylic and methacrylic acids; maleic acid; maleic acid half ester or anhydride; itaconic acid; itaconic acid half ester or anhydride; citraconic acid; citraconic acid half ester or anhydride; and substituted analogues thereof. Suitable comonomers, which form the low molecular weight copolymer binder include styrene, substituted styrenes, and unsaturated carboxylic acid derivatives, such as, for example, esters and amides of acrylic and methacrylic acids. Methyl methacrylate, ethyl methacrylate, butyl methacrylate, methacrylamide, methyl acrylate, ethyl acrylate, butyl acrylate, acrylamide, hydroxethyl acrylate, hydroxyethyl methacrylate and styrene are preferred.

Suitable high molecular weight copolymer cobinders, which are used in combination with the low molecular weight carboxylic acid containing copolymer binder component, are formed from the same components as the low molecular weight copolymer.

The acrylated urethane is generally a urethane diacrylate which is the reaction product of toluene diisocyanate with a polyol with the end isocyanate groups end-capped with hydroxyethyl acrylate. The acrylated urethane may also include diacrylates and triacrylates which are carboxylated to provide acid numbers ranging from 1 to 50 or more and molecular weights ranging from 500 to 5000. Carboxylated urethane diacrylates and triacrylates are particularly advantageous since they provide cleaner development in aqueous basic developer.

Both layers of the coating use a photoinitiator or photoinitiator system. Numerous conventional photoinitiator systems are known to those skilled in the art and may be used herein provided they are compatible with the other ingredients of the coating composition.

The second layer of the photoimageable coating is a blocked polyisocyanate crosslinking agent. The crosslinking agent includes those blocked polyisocyanates or mixtures of polyisocyanates which have a cleavage temperature of at least 100° C. Particularly preferred blocked polyisocyanates are methylethyl ketoxime blocked 1,6-diisocyanatohexane trimers and methylethyl ketoxime blocked isophorone diisocyanate.

Copper Oxide Layer

In another embodiment, the copper or copper alloy substrate is treated to form a copper oxide layer on the surface of the substrate. The copper oxide is formed by treating the copper or copper alloy substrate with an aqueous oxidizing composition. The oxidizing compositions may include oxidzing agents such as sodium chlorite, potassium persulfate, potassium chlorate, potassium perchlorate, etc. The oxidzing solution is applied by dipping, , spraying or the like. The oxidzing compositions and methods of application are described in U.S. Pat. No. 4,902,551, issued to Nakaso et al, which is hereby incorporated by reference.

Reduced Copper Oxide Layer

In another embodiment, a reduced copper oxide layer is formed on the copper or copper alloy substrate. The reduced copper oxide layer is formed with an aqueous aldehyde solution while applying a potential to the copper oxide layer; after contacting a metal piece made of copper metal or a metal nobler than copper, or after contacting with an aqueous solution of alkali borohydride. The aldehyde may be formaldehyde, paraformaldehyde or benzaldehyde. The compositions and methods for making the reduced copper oxide layer are described in U.S. Pat. No. 4,902,551, issued to Nakaso et al, which is hereby incorporated by reference.

EXAMPLES

For the following examples aqueous etching solutions, aqueous coating solutions, aqueous mixtures of etchant and coating solution, and aqueous stripping solutions were used as described in accompanying tables. The aqueous etching solutions were prepared using 30.5% sulfuric acid, 5.7% thiourea, 30 g/l wet copper thiourea sulfate crystals, saturated oxygen, saturated helium, 1% saturated iodine solution, 1% sodium hypochlorite, 2.5% cobalt oxide, 5% 0.2N BriBrO$_3$ solution, 5% ferric chloride, 10% methane sulfonic acid (70% MSA), 5.7% 1-methyl-3-propyl-imidazole-2-thione (PTI), 5% copper thiourea methane sulfonate complex, 5% copper PTI sulfuric acid complex.

TABLE 1

Etching solutions:

| Etchant | Composition: |
| --- | --- |
| E1 | Sulfuric acid, thiourea, copper thiourea sulfate, dissolved oxygen |
| E2 | Sulfuric acid, thiourea, copper thiourea sulfate, iodine |
| E3 | Sulfuric acid, thiourea, copper thiourea sulfate, sodium hypochlorite |
| E4 | Sulfuric acid, thiourea, copper thiourea sulfate, cobalt oxide |
| E5 | Sulfuric acid, thiourea, copper thiourea sulfate, Br$^-$/BrO$_3$ |
| E6 | Sulfuric acid, thiourea, copper thiourea sulfate, ferric chloride |
| E7 | Methane sulfonic acid, thiourea, copper thiourea methane sulfonate complex, dissolved oxygen |
| E8 | Sulfuric acid, PTI, copper PTI sulfuric acid complex, dissolved oxygen |
| Comparative E1 | Sulfuric acid, thiourea, dissolved oxygen |
| Comparative E2 | Sulfuric acid, thiourea, copper thiourea sulfate, saturated with helium gas |

The aqueous coating solutions are described in table 2.

|  | C-1 | C-2 | C-3 | C-4 | C-5 |
| --- | --- | --- | --- | --- | --- |
| Stannous Methane Sulfonate | 6 g/l | 27 g/l | 10 g/l | 10 g/l | 10 g/l |
| Bismuth Methane Sulfonate | — | — | — | 2 g/l | — |
| Indium methane sulfonate | — | — | — | — | 1 g/l |
| Sulfuric Acid | 10% | — | 10% | — | — |
| Methane sulfonic acid | — | 6% | — | 10% | 10% |
| Citric acid | — | 28% | — | — | — |
| Urea | 40 g/l | — | — | — | — |
| Thiourea | 6 g/l | 10 g/l | — | 60 g/l | 60 g/l |
| PTI[1] | — | — | 60 g/l | — | — |

1 = 1-methyl-3-propyl-imidazole-2-thione

The aqueous mixtures of etching and coating solution are described in table 3.

|  | M-1 | M-2 | M-3 | M-4 |
| --- | --- | --- | --- | --- |
| Sulfuric Acid | 10% | 10% | 10% | — |
| Methane sulfonic acid | — | — | — | 6% |
| Citric acid | — | — | — | 28% |
| Urea | 40 g/l | 40 g/l | — | — |
| Thiourea | 6 g/l | 6 g/l | — | 10 g/l |
| PTI[1] | — | — | 60 g/l | — |
| Copper thiourea sulfate | 6 g/l | 4 g/l | — | — |
| Copper PTI[1] sulfate | — | — | 4 g/l | — |
| Copper thiourea methane sulfonate | — | — | — | 5 g/l |
| Stannous Methane Sulfonate | 6 g/l | 6 g/l | 10 g/l | 27 g/l |
| Bismuth Methane Sulfonate | — | — | — | — |
| Indium methane sulfonate | — | — | — | — |

1 = 1-methyl-3-propyl-imidazole-2-thione

Stripping solutions were used as described in table 4.

TABLE 4

Stripping Solutions:

| Stripper | Description |
| --- | --- |
| S1 | McGean-Rohco Rostrip M-20 |
| S2 | McGean-Rohco Rostrip M-50 |

Example 1

A solution of E1 was sprayed for 60 seconds at 100° F. onto a conventional copper surface using the single jet method. Examination by SEM showed that the surface had numerous shallow depressions or cups. In other words, the surface was non uniformly etched. The number of depressions was much greater near the impingement zone and in the wall jet region (<5 mm from impingement) than in other regions.

Example 2

A solution of E1 was sprayed for 60 seconds at 100° F. onto a conventional copper surface using the single jet method. Then a solution of C1 was sprayed onto the surface for 60 seconds at room temperature. The resulting panel had white/shiny color associated with a successful application of immersion tin. Examination by SEM showed that the surface was similar to example 2 (non uniformly etched).

Example 3

A solution of E1 was sprayed for 10 seconds at 100° F. onto a conventional copper surface using the single jet method. Then a solution of C1 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 4

A solution of E1 was sprayed for 10 seconds at 100° F. onto a reverse treated copper surface using the single jet method. Then a solution of C1 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The quantity of pores was greater near the impingement zone and the wall jet region than in other regions greater than 5 mm from the impingement point. Also, the pores seemed to be more numerous near the 'tops' of the MLS protrusions near the impingement zone and the wall jet region. In the zones greater than 5 mm from the impingement point the pores tended to be more numerous near the base of the protrusions.

Example 5

A solution of E2 was sprayed for 10 seconds at 100° F. onto a reverse treated copper surface using the single jet method. Then a solution of C1 was sprayed onto the surface for 10 seconds at room temperature. This cycle was repeated eight times. The resulting panel had white/shiny color associated with a successful application of immersion tin. The panel was then immersed into a solution of S1 for 120 seconds. The white/shiny color was no longer present and a deep rich copper color was present. Examination by SEM showed that the surface contained numerous pores less than 10 microns in diameter. The quantity of pores was greater near the impingement zone and the wall jet region than in other regions greater than 5 mm from the impingement point. Also, the pores seemed to be more numerous near the 'tops' of the MLS protrusions near the impingement zone and the wall jet region. In the zones greater than 5 mm from the impingement point the pores tended to be more numerous near the base of the protrusions. Energy dispersive x-ray analysis of the surface showed that the tin concentration near the surface was undetectable.

Example 6

A solution of E3 was sprayed for 10 seconds at 100° F. onto a conventional copper surface using the single jet method. Then a solution of C1 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 7

A solution of E4 was sprayed for 10 seconds at 100° F. onto a conventional copper surface using the single jet method. Then a solution of C1 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 8

A solution of E5 was sprayed for 10 seconds at 100° F. onto a conventional copper surface using the single jet method. Then a solution of C1 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 9

A solution of E6 was sprayed for 10 seconds at 100° F. onto a conventional copper surface using the single jet method. Then a solution of C1 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions

Example 10

A solution of E7 was sprayed for 10 seconds at 100° F. onto a conventional copper surface using the single jet method. Then a solution of C2 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 11

A solution of E8 was sprayed for 10 seconds at 100° F. onto a conventional copper surface using the single jet method. Then a solution of C3 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 12

A solution of E1 was sprayed for 10 seconds at 100° F. onto a conventional copper surface using the single jet method. Then a solution of C4 was sprayed onto the surface for 10 seconds at room temperature. This cycle was repeated eight times. The resulting panel had white color associated with a successful application of immersion tin/bismuth alloy. Examination by SEM showed that the surface contained numerous pores less than 10 microns in diameter. The pores were interconnected. The quantity of pores was greater near the impingement zone and the wall jet region than in other regions.

Example 13

A solution of E1 was sprayed for 10 seconds at 100° F. onto a conventional copper surface using the single jet method. Then a solution of C5 was sprayed onto the surface for 10 seconds at room temperature. This cycle was repeated eight times. The resulting panel had the off white color associated with a successful application of immersion tin/indium alloy. Examination by SEM showed that the surface contained numerous pores less than 10 microns in diameter. The pores were interconnected. The quantity of pores was greater near the impingement zone and the wall jet region than in other regions.

Example 14

A solution of E1 was sprayed for 10 seconds at 100° F. onto a brass Hull Cell surface using the single jet method. Then a solution of C1 was sprayed onto the surface for 10 seconds at room temperature. This cycle was repeated eight times. The resulting panel had white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 15

RTF copper foil, after cleaning in a dilute solution of sodium hydroxide at 100° F., cold water rinsing, etching for 10 seconds in a solution of 5% $H_2SO_4$ and 2% of 35% $H_2O_2$ and cold water rinsing was immersed into a solution of M1 at 110° F. containing 6 g/l Cu as copper thiourea sulfate and sparged with compressed air for 60 seconds. The resulting foil had the white/shiny color associated with a successful application of immersion tin. Examination by SEM showed that the surface had a few pores less than 10 microns in diameter usually greater in number toward the top of the MLS protrusions but had also produced large scalloped ridges near the base of the RTF protrusions.

Example 16

RTF copper foil, after cleaning in a dilute solution of sodium hydroxide at 100° F., cold water rinsing, etching for 10 seconds in a solution of 5% $H_2SO_4$ and 2% of 35% $H_2O_2$ and cold water rinsing was immersed into a solution of M2 at 110° F. containing 6 g/l Cu as copper thiourea sulfate and sparged with helium for 60 seconds. The resulting foil had the white/shiny color associated with a successful application of immersion tin. Examination by SEM showed that the surface had essentially no pores.

Example 17

Using the single jet apparatus M1 at a temperature of 110° F. and with a copper thiourea sulfate concentration of 6 g/l as Cu was sprayed onto the surface of a conventional copper foil for 60 seconds. The resulting foil had the white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 18

Using the single jet apparatus M2 at a temperature of 110° F. and with a copper thiourea sulfate concentration of 6 g/l as Cu was sprayed onto the surface of a conventional copper foil for 60 seconds. The resulting foil had the white/shiny color associated with a successful application of immersion tin. Examination by SEM showed that the surface contained no pores.

Example 19

Using the single jet apparatus M3 at a temperature of 110° F. and with a copper PTI sulfate concentration of 4 g/l as Cu was sprayed onto the surface of a conventional copper foil for 60 seconds. The resulting foil had the white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 20

Using the single jet apparatus M4 at a temperature of 110° F. and with a copper thiourea MSA concentration of 5 g/l as Cu was sprayed onto the surface of a conventional copper foil for 60 seconds. The resulting foil had the white/shiny color associated with a successful application of immersion tin. Examination by SEM showed that the surface contained numerous pores less than 10 microns in diameter. The pores were interconnected. The quantity of pores was greater near the impingement zone and the wall jet region than in other regions.

Example 21

Using the conveyorized spray line apparatus M1 at a temperature of 100° F. and with a copper thiourea sulfate concentration of 6 g/l as Cu was sprayed onto the surface of a reverse treated copper foil for 30 seconds dwell time. The resulting foil had the white/shiny color associated with a successful application of immersion tin. Examination by SEM showed that the surface contained abundant pores which were interconnected and in general had diameters less than 10 microns.

Example 22

Using the conveyorized spray line apparatus M1 at a temperature of 120° F. and with a copper thiourea sulfate concentration of 6 g/l as Cu was sprayed onto the surface of a reverse treated copper foil for 30 seconds dwell time. The resulting foil had the white/shiny color associated with a successful application of immersion tin. Examination by SEM showed that the surface was covered in pores which were interconnected and in general had diameters less than 10 microns.

Example 23

Using the conveyorized spray line apparatus M1 at a temperature of 120° F. and with a copper thiourea sulfate concentration of 6 g/l as Cu was sprayed onto the surface of a reverse treated foil for 15 seconds dwell time. The resulting foil had the white/shiny color associated with a successful application of immersion tin. Examination by SEM showed that the surface had very few pores which were interconnected and in general had diameters less than 10 microns.

Example 24

Using the conveyorized spray line apparatus M1 at a temperature of 120° F. and with a copper thiourea sulfate concentration of 6 g/l as Cu was sprayed onto the surface of a reverse treated foil for 45 seconds dwell time. The resulting foil had the white/shiny color associated with a successful application of immersion tin. Examination by SEM showed that the surface was covered in pores which were interconnected and in general had diameters less than 10 microns and that the peaks of the RTF protrusions had been 'eroded' away in the process.

The following are comparative examples. The examples lack one or more of either an oxidizing agent or copper complex.

Comparative Example A

A solution of Comparative Example 1 was sprayed for 60 seconds at room temperature onto a conventional copper surface using the single jet method. Examination by SEM showed that the surface was uniformly etched.

Comparative Example B

A solution of Comparative E2 was sprayed for 60 seconds at 100° F. onto a conventional copper surface using the single jet method. Examination by SEM showed that the surface was uniformly etched.

Comparative Example C

A solution of Comparative E2 was sprayed for 10 seconds at 100° F. onto a reverse treated copper surface using the single jet method. Then a solution of C1 was sprayed onto the surface for 10 seconds at room temperature. This cycle was repeated eight times. The resulting panel had white/shiny color associated with a successful application of immersion tin. Examination by SEM showed that the surface did not have pores.

Comparative Example D

RTF copper foil, after cleaning in a dilute solution of sodium hydroxide at 100° F., cold water rinsing, etching for 10 seconds in a solution of 5% $H_2SO_4$ and 2% of 35% $H_2O_2$ and cold water rinsing was immersed into a solution of M1 without any copper thiourea sulfate at 110° F. and sparged with compressed air for 60 seconds. The resulting foil had the white/shiny color associated with a successful application of immersion tin. Examination by SEM showed that the surface was not porous.

Comparative Example E

Using the single jet apparatus Ml at a temperature of 110° F. and with a copper thiourea sulfate concentration of 0 g/l as Cu was sprayed onto the surface of a conventional copper foil for 60 seconds. The resulting foil had the white/shiny color associated with a successful application of immersion tin. Examination by SEM showed that the surface had essentially no pores.

Comparative Example F

Using the conveyorized spray line apparatus M1 at a temperature of 110° F. and with a copper thiourea sulfate concentration of 0 g/l as Cu was sprayed onto the surface of a conventional copper foil for 30 seconds dwell time. The resulting foil had the white/shiny color associated with a successful application of immersion tin. Examination by SEM showed that the surface had essentially no pores.

Comparative Example G

Using the conveyorized spray line apparatus M1 at a temperature of 75° F. and with a copper thiourea sulfate concentration of 6 g/l as Cu was sprayed onto the surface of a conventional copper foil for 30 seconds dwell time. The resulting foil had the white/shiny color associated with a successful application of immersion tin. Examination by SEM showed that the surface contained very few pores.

Example 25

Reverse treated copper laminate Polyclad laminates, Inc., Franklin, N.H. was prepared using the method outlined in Example 22 and then post treated using McGean-Rohco 776PT, then laid up to make a five layer multilayer board using techniques well understood by those in the industry. A similar multilayer board was prepared using the method outlined in Comparative Example F. Coupons from these two boards were then simultaneously immersed into molten solder at various temperatures and the times to delamination compared. The coupons which were made from porous laminate exceeded the times to delamination of the coupons made from non porous laminate as described in Table 5.

TABLE 5

| Temperature of molten solder | % increase in time to delamination of a 5 layer multilayer board with channels vs. similar board without channels |
| --- | --- |
| 450° F. | 125% |
| 475° F. | 160% |
| 500° F. | 250% |
| 550° F. | 400% |

Example 26

Using both conventional and reverse treated copper laminate treatments of the surface using the methods outlined in Examples 15 and 16 and Comparative Example G were performed. The resulting laminates were made into 5 layer McGean-Rohco 776 PT treated printed wiring boards as described in Example 32 and cut into coupons. These coupons were then exposed to 85° C/85% relative humidity for 72 hours, subsequently allowed to sit for 24 hours at room temperature, then immersed in molten solder at 288° C. The results of these tests are presented in Table 6.

TABLE 6

Time to Delamination in 288° C. Molten Solder Following Exposure to 85° C./85% relative humidity for 72 hours:

| Treatment method: | Amount of interconnected channels less than 10μ in diameter | Conventional Copper Laminate | Reverse Treated Copper Laminate |
| --- | --- | --- | --- |
| Comparative Example H | none | 40 seconds | 45 seconds |
| Example 15 | many | 45 seconds | 50 seconds |
| Example 16 | entire surface | 75 seconds | 75 seconds |

As can be seen from Table 6, the methods of the present invention provide pores which form interconnected channels on the copper or copper alloy substrate.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method of producing a substrate which includes preparing a surface capable of making a cocontinuous bond comprising the steps of 1) obtaining a copper or copper alloy substrate and 2) applying an etching composition which comprises (a) an acid, (b) an oxidizing agent, (c) a copper complexing agent selected from the group consisting of thioureas and imidazole-thiones, and (d) a copper complex, wherein the copper complex is present in an amount which precipitates when applied to the copper or copper alloy substrate.

2. The method of claim 1 wherein the etching composition is applied by spraying.

3. The method of claim 1 wherein the etching composition is applied by immersing the substrate in the etching composition.

4. The method of claim 1 further comprising the step of 3) treating the substrate with a coating composition.

5. The method of claim 4 wherein the coating composition is an immersion metal coating composition.

6. The method of claim 5 wherein the metal of the immersion metal coating composition is selected from the group consisting of bismuth, gallium, germanium, gold, indium, lead, palladium, silver, tin and alloys of said meals.

7. The method of claim 4 wherein steps 2 and 3 are repeated, sequentially.

8. The method of claim 4 wherein steps 2 and 3 are repeated at least 4 times, sequentially.

9. The method of claim 4 further comprising the step of 4) applying a stripping composition to the substrate.

10. The method of claim 1 wherein a coating composition is applied to the substrate simultaneously with the etching composition.

11. A method of producing a substrate which includes preparing a surface capable of making a cocontinuous bond comprising the steps of:
   1) obtaining a copper or copper alloy substrate;
   2) applying an etching composition which comprises (a) an acid, (b) an oxidizing agent, (c) a copper complexing agent and (d) a copper complex; and
   3) treating the substrate with a coating composition; wherein the copper complex is present in an amount which precipitates when applied to the copper or copper alloy substrate and wherein the coating composition is an immersion metal coating composition.

12. The method of claim 11 wherein the metal of the immersion. metal coating composition is selected from the group consisting of bismuth, gallium, germanium, gold, indium, lead, palladium, silver, tin and alloys of said metals.

13. A method of producing a substrate which includes preparing a surface capable of making a cocontinuous bond comprising the steps of:
   1) obtaining a copper or copper alloy substrate;
   2) applying an etching composition which comprises (a) an acid, Cb) an oxidizing agent, (c) a copper complexing agent and (d) a copper complex; and
   3) treating the substrate with a coating composition; wherein the copper complex is present in an amount which precipitates when applied to the copper or copper alloy substrate and wherein steps 2 and 3 are repeated sequentially.

14. A method of producing a substrate which includes preparing a surface capable of making a cocontinuous bond comprising the steps of:
   1 ) obtaining a copper or copper alloy substrate;
   2) applying an etching composition which comprises (a) an acid, (b) an oxidizing agent, (c) a copper complexing agent and (d) a copper complex;
   3) treating the substrate with a coating composition; wherein the copper complex is present in an amount which precipitates when applied to the copper or copper alloy substrate and wherein steps 2 and 3 are repeated at least 4 times sequentially.

15. A method of producing a substrate which includes preparing a surface capable of making a cocontinuous bond comprising the steps of:
   1) obtaining a copper or copper alloy substrate;
   2) applying an etching composition which comprises (a) an acid, (b) an oxidizing agent, (c) a copper complexing agent and (d) a copper complex;
   3) treating the substrate with a coating composition; and
   4) applying a stripping composition to the substrate; wherein the copper complex is present in an amount which precipitates when applied to the copper or copper alloy substrate.

16. A method of producing a substrate which includes preparing a surface capable of making a cocontinuous bond comprising the steps of:
   1) obtaining a copper or copper alloy substrate; and
   2) applying an etching composition which comprises (a) an acid, (b) an oxidizing agent, (c) a copper complexing agent and (d) a copper complex; wherein the copper complex is present in an amount which precipitates when applied to the copper or copper alloy substrate and wherein a coating composition is applied to the substrate simultaneously with the etching composition.

* * * * *